United States Patent
Govindaraj et al.

(10) Patent No.: US 9,470,739 B2
(45) Date of Patent: Oct. 18, 2016

(54) DC LINK CAPACITANCE MEASUREMENT FOR ELECTRIC VEHICLE DRIVETRAIN

(71) Applicant: FORD GLOBAL TECHNOLOGIES, LLC, Dearborn, MI (US)

(72) Inventors: Arvind Govindaraj, Dearborn, MI (US); Guangyin Lei, Dearborn Heights, MI (US); Mansur A. Blackman, Dearborn, MI (US); Chingchi Chen, Ann Arbor, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 476 days.

(21) Appl. No.: 14/077,654

(22) Filed: Nov. 12, 2013

(65) Prior Publication Data
US 2015/0130273 A1    May 14, 2015

(51) Int. Cl.
*G01R 31/02* (2006.01)
*B60L 11/02* (2006.01)
*G01R 27/26* (2006.01)
*B60L 3/00* (2006.01)

(52) U.S. Cl.
CPC .......... *G01R 31/028* (2013.01); *B60L 3/003* (2013.01); *B60L 11/02* (2013.01); *G01R 27/2605* (2013.01); *B60L 2240/526* (2013.01); *B60L 2240/527* (2013.01); *B60L 2240/529* (2013.01); *Y02T 10/70* (2013.01); *Y02T 10/7077* (2013.01)

(58) Field of Classification Search
CPC .. B60L 11/02; B60L 3/003; B60L 2240/526; B60L 2240/527; B60L 2240/529; G01R 27/2605; G01R 31/028; Y02T 10/70; Y02T 10/7077

USPC .......................................... 324/548; 307/10.1
See application file for complete search history.

(56) References Cited

U.S. PATENT DOCUMENTS

| | | | |
|---|---|---|---|
| 4,651,266 A * | 3/1987 | Fujioka | H02M 1/14 363/126 |
| 7,135,835 B2 * | 11/2006 | Yamada | H02P 23/06 318/800 |
| 7,557,555 B2 | 7/2009 | Wang et al. | |

(Continued)

FOREIGN PATENT DOCUMENTS

| | | |
|---|---|---|
| JP | 2004037258 | 5/2004 |
| KR | 1020050068958 | 7/2005 |

(Continued)

*Primary Examiner* — Rexford Barnie
*Assistant Examiner* — Elim Ortiz
(74) *Attorney, Agent, or Firm* — David B. Kelley; MacMillan, Sobanski & Todd, LLC

(57) ABSTRACT

In order to detect deterioration of a DC link capacitor between a DC source and an inverter load in an electric propulsion vehicle, capacitance of the link capacitor must be accurately measured during in-service use. A charge is established on the link capacitor. The capacitor is isolated from the source and the inverter load. A constant current circuit is activated to discharge the capacitor. A first voltage is measured across the capacitor at a first time during the discharging. A second voltage is measured across the capacitor at a second time during the discharging. A discharge current flowing from the capacitor is measured during the discharging. The capacitance is calculated in response to the discharge current multiplied by a ratio of a difference between the second and first times to a difference between the first and second voltages. The calculated capacitance is monitored for a decline indicative of a failure.

10 Claims, 4 Drawing Sheets

(56) References Cited

U.S. PATENT DOCUMENTS

| | | |
|---|---|---|
| 8,004,267 B2 | 8/2011 | Chen et al. |
| 8,233,294 B2 | 7/2012 | Chen et al. |
| 8,380,451 B2 | 2/2013 | Chen et al. |
| 2006/0208493 A1* | 9/2006 | Harbourt ............ F03D 7/0224 290/44 |
| 2010/0070212 A1* | 3/2010 | Williams ............ G01R 31/42 702/58 |
| 2011/0032652 A1* | 2/2011 | Shimada ............ H02M 5/293 361/91.2 |
| 2011/0241581 A1* | 10/2011 | Flock ................. B60L 3/04 318/400.3 |
| 2012/0043172 A1* | 2/2012 | Ichikawa ............ B60L 5/005 191/45 R |
| 2012/0056567 A1* | 3/2012 | Savagian ........... B60L 11/005 318/400.3 |
| 2013/0155729 A1 | 6/2013 | Lee |
| 2014/0002104 A1* | 1/2014 | Yang .................. G01R 31/42 324/548 |
| 2014/0029308 A1* | 1/2014 | Cojocaru ........... H01G 4/38 363/13 |

FOREIGN PATENT DOCUMENTS

| | | |
|---|---|---|
| KR | 1020110133513 | 12/2011 |
| KR | 1020120034451 | 4/2012 |
| WO | 0218962 A1 | 3/2002 |
| WO | 2012119232 A1 | 9/2012 |

* cited by examiner

DC LINK CAPACITANCE MEASUREMENT FOR ELECTRIC VEHICLE DRIVETRAIN

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to electric drive circuits for road vehicles, and, more specifically, to measuring the capacitance of a DC link capacitor to support determination of a state of health of the link capacitor.

Electric drive systems for traction motors in electric and/or hybrid road vehicles typically require conversion of electrical power from a DC source to an alternating current signal at a variable frequency and power for driving an AC traction motor. The DC source itself may include a storage device such as a battery or fuel cell and a DC-to-DC converter for stepping up the DC voltage supplied to the AC inverter. A necessary component for coupling the DC source (e.g., the battery or an intermediate DC-to-DC converter) to the DC-to-AC inverter is a DC link capacitor.

In automotive vehicle applications, the DC link capacitor is typically comprised of a film capacitor such as a metalized polypropylene film to take advantage of their relatively low cost and robustness. The DC link capacitor performance is vital to the functioning of the inverter system, and any degradation in its properties can lead to a loss of proper functioning of the inverter.

During extended use, film capacitors in particular may be subject to deterioration as a result of high operating temperatures, high operating voltages (e.g., voltage spikes), high humidity, and manufacturing defects such as impurities or film defects. To help ensure that DC link capacitors properly perform their intended functions for the desired lifetime of a vehicle, it is a common practice to select a capacitor design with performance specifications greater than what is normally encountered during use. This allows a higher confidence in withstanding worst case conditions but results in increased costs. In order to reduce cost and improve overall operation using a capacitor design that is better matched to normal conditions, it becomes necessary to monitor the state of health of the link capacitor so that it can be replaced in the event of a degradation which could lead to failure.

Degradation of the link capacitor is typically specified in terms of a defined loss in its capacitance, e.g., a 5% loss from its initial value. The change of capacitance is an indicator of physical processes that take place inside the capacitor on an ongoing basis. In one particular method for predicting failure of the DC link capacitor, its capacitance can be determined automatically and periodically during its lifetime.

SUMMARY OF THE INVENTION

In one aspect of the invention, a method is provided for detecting deterioration of a DC link capacitor between a DC source and an inverter load. A charge is established on the link capacitor. The link capacitor is isolated from the source and the inverter load. A constant current circuit is activated to discharge the link capacitor. A first voltage is measured across the link capacitor at a first time during the discharging. A second voltage is measured across the link capacitor at a second time during the discharging. A discharge current flowing from the link capacitor is measured during the discharging. The capacitance is calculated in response to the discharge current multiplied by a ratio of a difference between the second and first times to a difference between the first and second voltages. The calculated capacitance is monitored for a decline indicative of a failure.

DETAILED DESCRIPTION OF PREFERRED EMBODIMENTS

Figure 1:
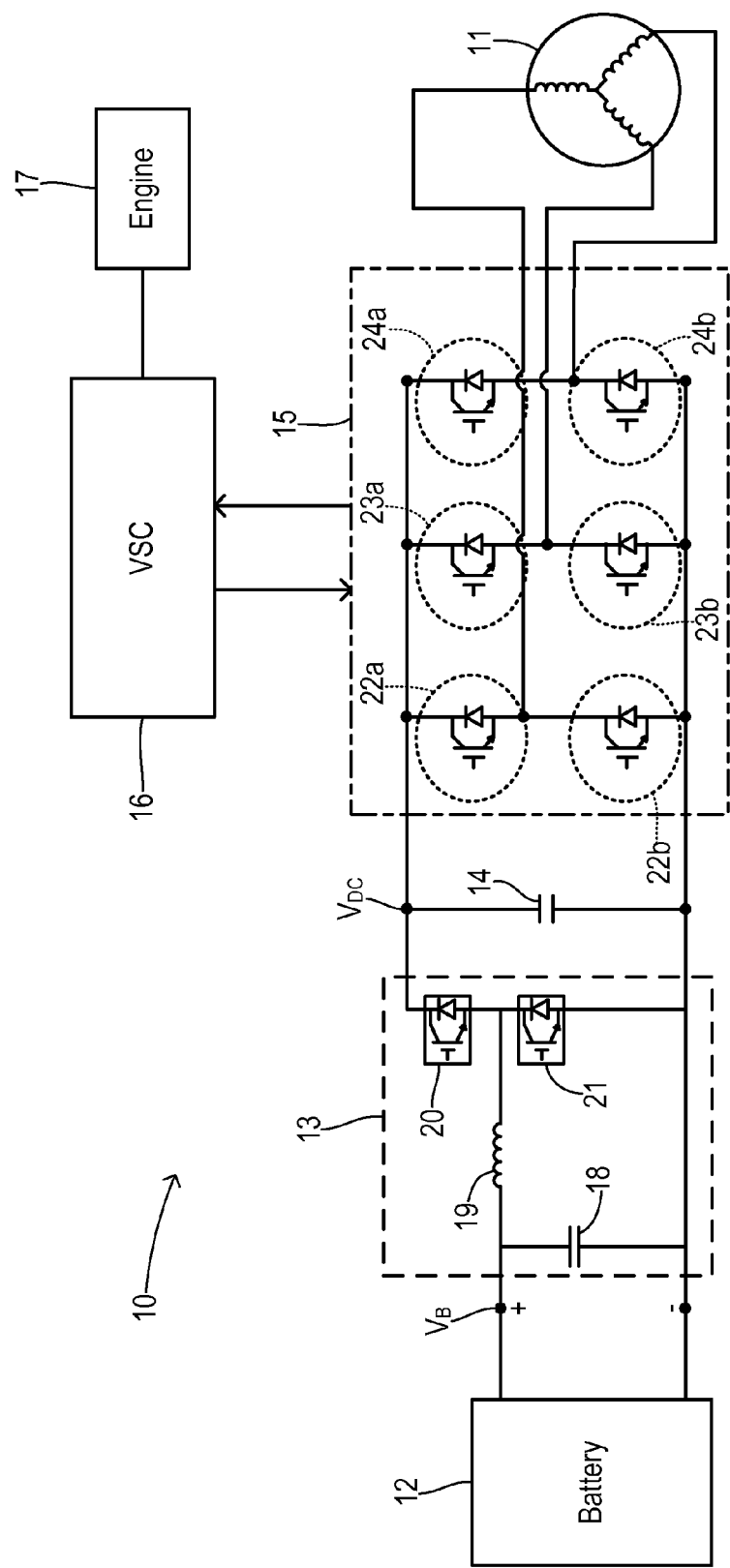
FIG. 1 is a schematic diagram showing an electric drive system having a DC to DC converter coupled to a battery and a DC to AC inverter coupled to a motor.

FIG. 1 shows a vehicle 10 having an electric drivetrain with a traction motor 11 and a battery 12. A battery voltage $V_B$ from battery 12 is converted by a boost converter 13 to a higher voltage $V_{DC}$ across a DC link capacitor 14. The converted DC voltage is inverted in a PWM inverter 15 for supplying an alternating voltage to traction motor 11. A vehicle system controller (VSC) 16 is connected to inverter 15 for implementing a known type of control strategy when the electric drivetrain is activated. In the case where vehicle 10 is a hybrid electric vehicle, VSC 16 is also coupled with a combustion engine 17 for operating vehicle 10 in gas-powered modes as known in the art.

In the illustrated embodiment, boost converter 13 includes a capacitor 18 and an inductor 19 connected to battery 12. A pair of power transistors 20 and 21 are selectably switched on and off at predetermined time intervals as known in the art in order to generate the desired voltage $V_{DC}$. Each power switch includes a freewheeling diode in parallel with the transistor as known in the art.

Inverter 15 has a first phase leg including power transistors 22a and 22b, a second phase leg having transistors 23a and 23b, and a third phase leg having transistors 24a and 24b. Transistors 20-24 may be controlled by VSC 16 or by another dedicated controller as known in the art.

DC link capacitor 14 possesses a relatively high capacitance. Failure of link capacitor 14 would prevent successful operation of the electric drivetrain.

Figure 2:
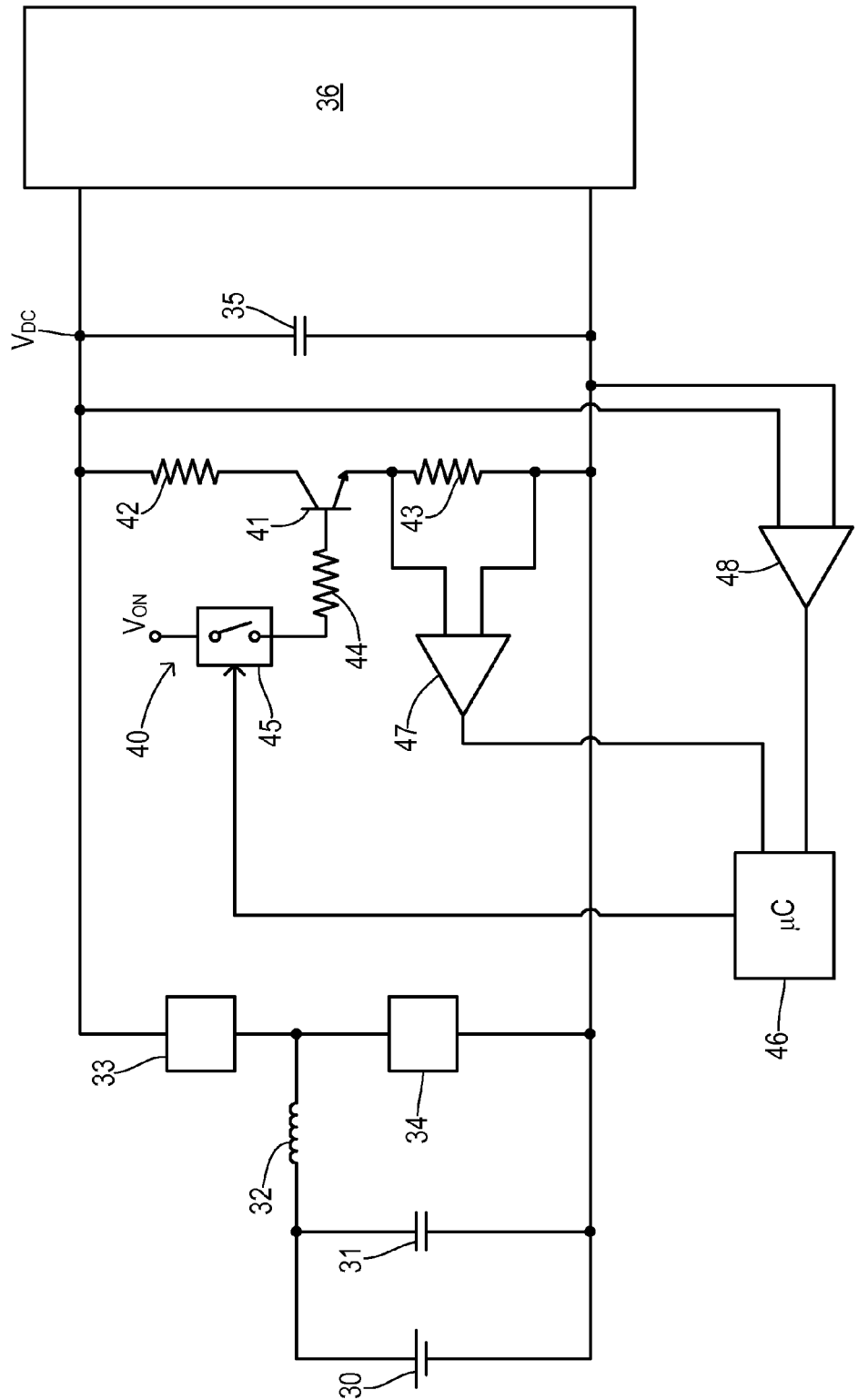
FIG. 2 is a schematic diagram showing one embodiment of a capacitance measuring circuit of the present invention.

FIG. 2 shows a first embodiment of the present invention for monitoring the DC link capacitance. A voltage $V_B$ from a DC source such as a battery 30 is boosted in a boost converter comprised of capacitor 31, inductor 32, and power switches 33 and 34. The converted DC voltage $V_{DC}$ is applied across a DC link capacitor 35 and is input to an inverter 36. The invention employs a constant current discharge circuit 40 which is active only during predetermined measuring periods to evaluate an instantaneous capacitance of link capacitor 35.

Discharge circuit 40 is coupled across link capacitor 35. Discharge circuit 40 provides an open circuit until it is activated, so that it does not interrupt normal operation of inverter 36. In this embodiment, discharge circuit 40 includes a bipolar junction transistor 41 with its collector coupled to $V_{DC}$ via a resistor 42 and has its emitter coupled to ground via a resistor 43. The base of transistor 41 is connected through a base resistor 44 to a switch 45 controlled by a microcontroller 46 to selectably provide a voltage $V_{ON}$ via switch 45 to cause transistor 41 to conduct during the measuring period. The voltage applied to the base of transistor 41 and the resistance of emitter resistor 43 are selected to ensure that transistor 41 operates in a constant current region so that during a measuring period link capacitor 35 will be discharged at a fixed, predetermined rate.

Other semiconductor devices besides a bipolar transistor can be used to create a constant current draw, such as a MOSFET or an IGBT. The semiconductor device should have a voltage rating sufficiently high to withstand (i.e., block) the highest voltages which may appear along the positive DC bus when the device is not turned on.

During the constant current draw, the voltage appearing on link capacitor 35 will ramp down at a rate which depends on the instantaneous capacitance. Thus, in order to calculate the capacitance, the present invention employs a current-sensing circuit 47 across emitter resistor 43 and a voltage-sensing circuit 48 across link capacitor 35. Each sensing circuit 47 and 48 may be comprised of an op-amp providing an output to microcontroller 46 for indicating the desired values of the constant discharge current $i_{dis}$ and the link capacitor voltage $V_{CAP}$.

If the current $i_{dis}$ is the only current discharging the link capacitor, the capacitor voltage $V_{CAP}$ at time T2, or V2 can be described by the following equation:

$$V_2 = V_1 + \frac{1}{C}\int_{t1}^{t2} i_{dis}\,dt \qquad \text{Eq. 1}$$

Where V1 is the capacitor voltage at time T1. This equation can also be expressed by a differential equation:

$$i_{dis} = C\frac{dV_{cap}}{dt} \qquad \text{Eq. 2}$$

If the discharge current is maintained constant, the equation can be simplified to:

$$V_2 = V_1 + \frac{i_{dis}(t2-t1)}{C} \qquad \text{Eq. 3}$$

$$\text{or } \Delta V = V_2 - V_1 = \frac{i_{dis}(t2-t1)}{C} \qquad \text{Eq. 4}$$

Figure 3:
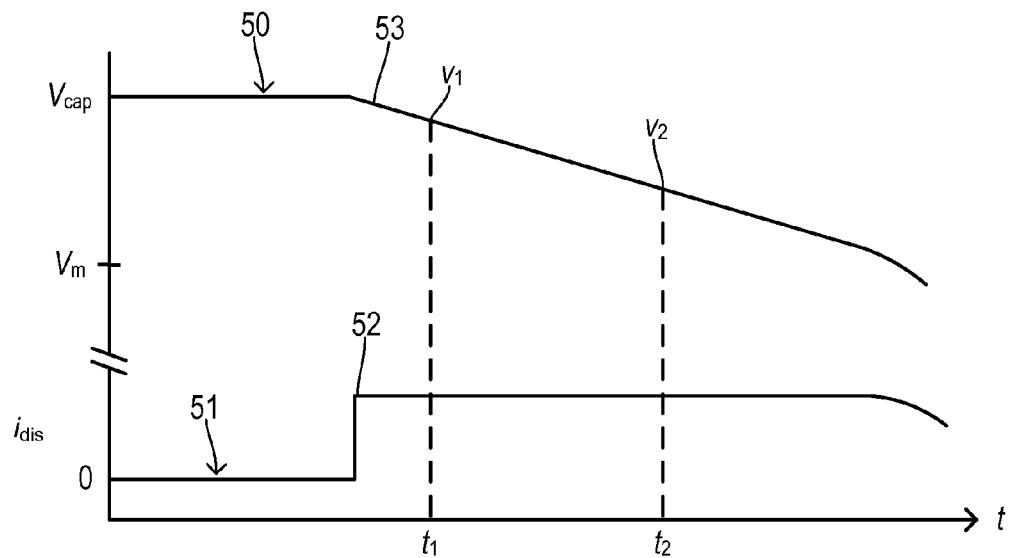
FIG. 3 is a plot showing voltage and current changes for the circuit of FIG. 2.

FIG. 3 shows a plot of the DC link capacitor voltage $V_{CAP}$ along a line 50 and discharge current $i_{dis}$ along a line 51. Before initiating a measurement, a charge is established on the link capacitor corresponding to an initial voltage that insures $V_{CAP}$ remains above a voltage margin $V_m$ described in more detail below. When the constant current discharge circuit is activated, discharge current $i_{dis}$ rises to a substantially fixed value at 52 which is then maintained during an entire measuring period. In response, the link capacitor voltage begins to decline at 53. During the discharge, the value of the link capacitor voltage is sampled at times T1 and T2 providing measurements $V_1$ and $V_2$. With the collected samples, the capacitance of the DC link capacitor 35 is found using the following formula:

$$C = \frac{\int_{t1}^{t2} i_{dis}\,dt}{V_2 - V} \qquad \text{Eq. 5}$$

If the discharge current is maintained constant, the above equation can be simplified to:

$$C = i_{dis}\frac{t_2 - t_1}{V_2 - V_1} \qquad \text{Eq. 6}$$

Once calculated by the controller, the capacitance C is stored for diagnostic purposes. It is compared with previous capacitance measurements and/or an initial specified value for the link capacitor so that any decline can be detected which is indicative of an imminent or existing failure of the link capacitor.

Returning to FIG. 2, it can be seen that link capacitor 35 must be isolated from the inverter load of inverter 36 and from the DC source (e.g., battery) so that the discharging of link capacitor 35 is determined solely by and through discharge circuit 40. To initiate a measuring period, controller 46 deactivates the phase leg switches in inverter 36. Isolation from the DC source may be provided by a switch (not shown) or by ensuring that the bus voltage $V_{DC}$ is sufficiently high to maintain reverse bias of any freewheeling diode contained in power switch 33. In other words, it is not sufficient to have power switch 33 turned off since the freewheeling diode could conduct from battery 30 if $V_{CAP}$ is not high enough to reverse bias the diode. The required voltage is designated $V_m$ which is equal to the battery voltage plus a standard diode drop. In the event that a boost converter is not used and link capacitor 35 is driven directly by battery 30, then a battery contactor switch would be required to provide the isolation.

In order to conduct a capacitance measurement, link capacitor 35 must first be charged to a voltage sufficient to maintain a discharge over the required period of time. The step of establishing a charge on link capacitor 35 may also succeed in isolating capacitor 35 from the DC source as explained above.

Voltage sensing of the op-amps used for current and voltage measurements may include inherent time delays due to filtering. The delays can be compensated for, as known in the art.

Figure 4:
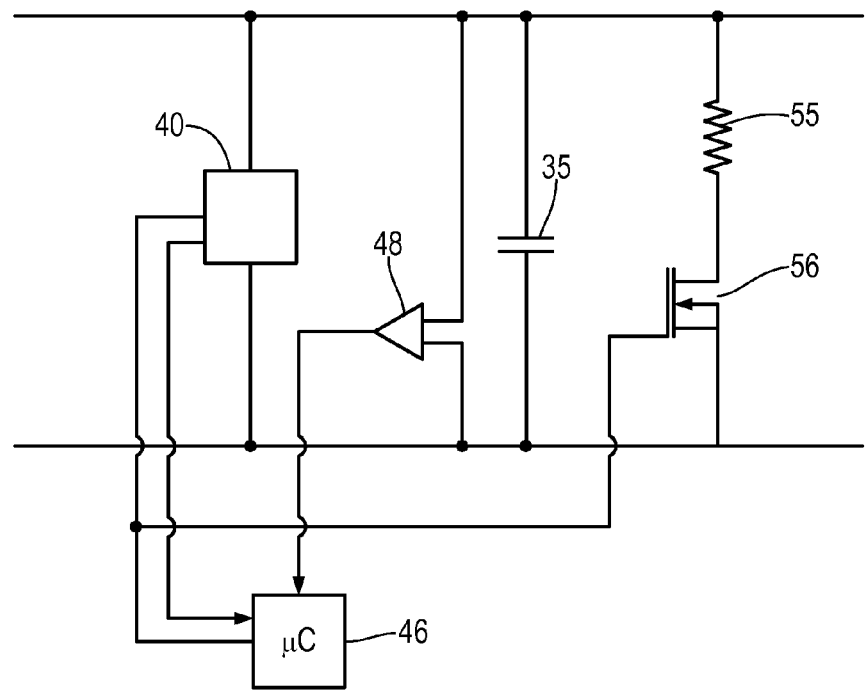
FIG. 4 is a schematic diagram showing another embodiment of the invention.

In order to avoid the presence of high voltages stored on the link capacitor, it should be discharged during times when a vehicle is not in use. Discharge circuit 40 can be used to perform such a function. If a faster discharge rate is desired, then an additional passive discharge resistor can be connected across the link capacitor in order to bleed off the charge more quickly when the electric drive is turned off. The resistance of the passive discharge resistor must be sufficiently high to avoid any significant effect on drive performance during normal operation and sufficiently low to discharge the link capacitor within a reasonable time after deactivating the drive. Whenever a passive discharge resistor is present, it becomes necessary to isolate the link capacitor from the passive discharge resistor during the measurement period. However, the passive nature of the operation for the passive discharge must be maintained. As shown a further embodiment of the invention in FIG. 4, a passive discharge resistor 55 is connected in series across link capacitor 35 together with a normally-on switching device 56 which is capable of being switched off by microcontroller 46 simultaneously with the turning on of the constant current discharge circuit 40. In the illustrated example, a depletion-mode MOSFET. Resistor 55 performs the desired discharge function except during a measuring period when switch 56 is actively being driven.

Figure 5:
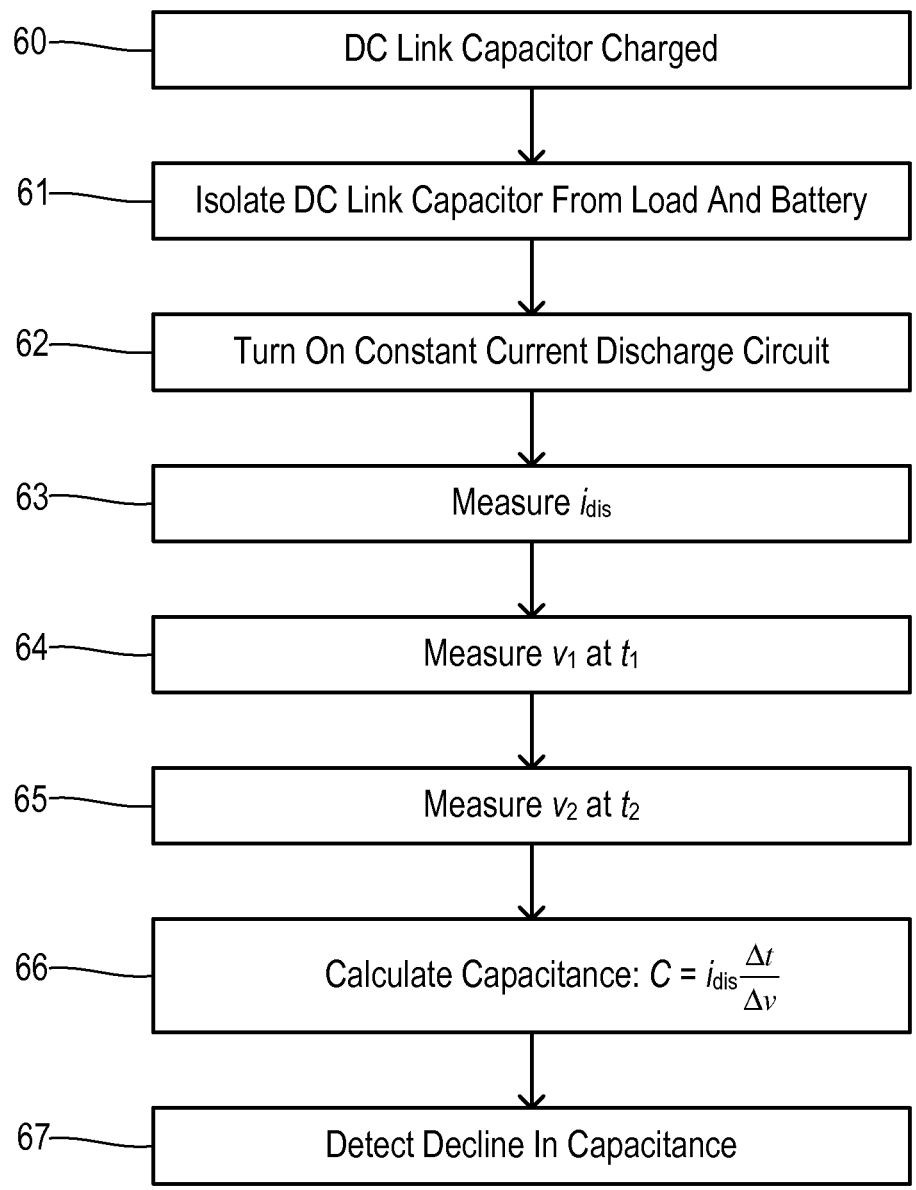
FIG. 5 is a flowchart showing one preferred method of the invention.

One preferred method of the invention is summarized in FIG. 5. At an appropriate time (e.g., during vehicle idling, during a start-up sequence, or during a shut-down sequence), the controller of the present invention implements a measuring period which begins by establishing a charge on the DC link capacitor in step 60. In step 61, the DC link capacitor is isolated from the load and battery. In step 62, the constant current discharge circuit is turned on. At any suitable time during the measurement period, the discharge current $i_{dis}$ is measured in step 63. In step 64, a first value of the link capacitor voltage $v_1$ is measured at a time $t_1$. A second sample of the capacitor voltage $v_2$ is collected at a subsequent time $t_2$ in step 65. In step 66, the capacitance of the link capacitor is calculated using the formula given above. Using the calculated capacitance, a decline in the capacitance can be detected in step 67 and used to indicate an impending or actual failure of the link capacitor.

What is claimed is:

1. A method of detecting deterioration of a DC link capacitor between a DC source and an inverter load, comprising the steps of: establishing an initial charge on the link capacitor; isolating the link capacitor from the source and the inverter load; activating a constant current circuit to discharge the link capacitor at a constant current; measuring a first voltage across the link capacitor at a first time during the discharging; measuring a second voltage across the link capacitor at a second time during the discharging, wherein the initial charge and a difference between the second and first times are selected so that the link capacitor is not fully discharged by the second time; measuring a discharge current flowing from the link capacitor during the discharging; calculating the capacitance in response to the discharge current multiplied by a ratio of the difference between the second and first times to a difference between the first and second voltages; and monitoring the calculated capacitance for a decline indicative of a failure.

2. The method of claim 1 wherein the step of establishing the initial charge on the link capacitor corresponds to a capacitor voltage greater than a voltage of the DC source by at least a predetermined margin.

3. The method of claim 1 wherein the step of isolating the link capacitor includes deactivating a plurality of inverter switches connected to the inverter load.

4. The method of claim 1 wherein a passive discharge resistor and a normally-on switching device are coupled in series across the link capacitor, further comprising the step of: turning off the normally-on switching device during the isolating and measuring steps.

5. An electric vehicle drive system comprising: a DC source; an inverter having a plurality of phase leg switches for providing alternating current to a load; a DC link capacitor coupled between the source and the inverter; a discharge circuit coupled across the link capacitor configured to provide an open circuit during operation of the inverter and to conduct at a constant current for discharging the link capacitor when activated; a current-sensing circuit coupled to the discharge circuit sensing a discharge current; a voltage-sensing circuit coupled to the link capacitor sensing a capacitor voltage; and a controller configured to a) initiate a measuring period by deactivating the phase leg switches, b) turn on the discharge circuit, c) collect a measure of the constant discharge current during the measuring period, d) collect a first capacitor voltage at a first time during the measuring period, e) collect a second capacitor voltage at a second time during the measuring period, and f) calculate the capacitance in response to the discharge current multiplied by a ratio of a difference between the second and first times to a difference between the first and second capacitor voltages.

6. The drive system of claim 5 wherein the discharge circuit is comprised of a transistor biased to conduct in its constant current region.

7. The drive system of claim 5 wherein the controller establishes a predetermined initial voltage on the link capacitor at a beginning of the measurement period.

8. The drive system of claim 7 wherein the predetermined initial voltage is greater than a voltage of the DC source by at least a predetermined margin.

9. The drive system of claim 5 further comprising a passive discharge resistor and a normally-on switching device coupled in series across the link capacitor, wherein the controller turns off the normally-on switching device during the measuring period.

10. The drive system of claim 5 wherein the controller detects a failed condition of the link capacitor in response to a calculated capacitance showing a predetermined decline from an initial capacitance.

* * * * *